United States Patent
Lee et al.

(10) Patent No.: US 9,263,676 B2
(45) Date of Patent: Feb. 16, 2016

(54) ORGANIC LIGHT-EMITTING DISPLAY SYSTEM AND METHOD OF MANUFACTURING THE SAME

(71) Applicant: Samsung Display Co., Ltd., Yongin, Gyeonggi-do (KR)

(72) Inventors: Jeong-Yeol Lee, Yongin (KR); Yoon-Hyeung Cho, Yongin (KR); Ouck Han, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/308,487

(22) Filed: Jun. 18, 2014

(65) Prior Publication Data
US 2014/0299862 A1    Oct. 9, 2014

Related U.S. Application Data

(62) Division of application No. 13/827,915, filed on Mar. 14, 2013, now Pat. No. 8,772,824.

(30) Foreign Application Priority Data

Nov. 19, 2012 (KR) .................. 10-2012-0131115

(51) Int. Cl.
*H01L 29/08* (2006.01)
*H01L 35/24* (2006.01)
(Continued)

(52) U.S. Cl.
CPC ............... *H01L 51/00* (2013.01); *H01L 27/00* (2013.01); *H01L 27/3272* (2013.01); *H01L 51/5246* (2013.01); *H01L 51/5256* (2013.01); *H01L 51/56* (2013.01)

(58) Field of Classification Search
CPC .............................. H01L 27/00; H01L 51/00
USPC ............................ 257/40, 100; 313/504, 512
See application file for complete search history.

(56) References Cited

U.S. PATENT DOCUMENTS 7,074,501 B2   7/2006   Czeremuszkin et al.
7,915,821 B2   3/2011   Kang
(Continued)

FOREIGN PATENT DOCUMENTS

KR   10-2006-0032089 A   4/2006
KR   10-2007-0054116 A   5/2007
(Continued)

OTHER PUBLICATIONS

Extended European Search Report dated Aug. 18, 2014 for European Patent Application No. EP 13 177 515.7 which shares priority of Korean Patent Application No. KR 10-2012-0131115 with captioned U.S. Appl. No. 14/308,487, and cites the above-identified references numbered 1-5.
(Continued)

*Primary Examiner* — Telly Green
(74) *Attorney, Agent, or Firm* — Knobbe Martens Olson & Bear LLP

(57) ABSTRACT

An organic light-emitting display system and a method of manufacturing the same are disclosed. In one aspect, the organic light-emitting display system includes a substrate, a display unit that defines an active area on the substrate and includes a plurality of thin film transistor (TFTs), and an encapsulation layer that seals the display unit and has a stacked structure in which at least a first inorganic film, a first organic film, and a second inorganic film are sequentially stacked. The TFTs includes an active layer, a gate electrode, a source electrode, a drain electrode, and an interlayer insulating film that is disposed between the gate electrode and the source electrode and between the gate electrode and the drain electrode, wherein the second inorganic film directly contacts the interlayer insulating film outside the active area. Accordingly, in various embodiments, since an inorganic layer of a thin film encapsulation layer is prevented from being cracked, penetration of external moisture or oxygen into the active area of the display can be reduced or prevents.

19 Claims, 4 Drawing Sheets

(51) Int. Cl.
*H01L 51/00* (2006.01)
*H01L 51/52* (2006.01)
*H01L 27/32* (2006.01)
*H01L 51/56* (2006.01)
*H01L 27/00* (2006.01)

(56) References Cited

U.S. PATENT DOCUMENTS

| | | |
|---|---|---|
| 8,247,809 B2 | 8/2012 | Kim |
| 8,502,756 B2 | 8/2013 | Nakamura et al. |
| 2007/0114521 A1 | 5/2007 | Hayashi et al. |
| 2007/0267973 A1 | 11/2007 | Suh |
| 2007/0281174 A1 | 12/2007 | Moro et al. |
| 2008/0079360 A1 | 4/2008 | Kubota |
| 2008/0238301 A1 | 10/2008 | Shim et al. |
| 2008/0278070 A1 | 11/2008 | Kim |
| 2008/0305360 A1 | 12/2008 | Han et al. |
| 2010/0134426 A1 | 6/2010 | Lee et al. |
| 2010/0200846 A1 | 8/2010 | Kwack et al. |
| 2011/0100458 A1 | 5/2011 | Kang et al. |
| 2011/0102308 A1 | 5/2011 | Nakamura et al. |
| 2011/0140164 A1 | 6/2011 | Seo et al. |
| 2011/0151200 A1 | 6/2011 | Erlat et al. |
| 2012/0091477 A1 | 4/2012 | Kim |
| 2012/0146492 A1 | 6/2012 | Ryu et al. |
| 2012/0161603 A1 | 6/2012 | Van Montfort et al. |
| 2013/0048867 A1 | 2/2013 | Cok |

FOREIGN PATENT DOCUMENTS

| | | |
|---|---|---|
| KR | 10-2012-0040480 A | 4/2012 |
| KR | 10-2012-0073275 A | 7/2012 |

OTHER PUBLICATIONS

Partial European Search Report dated Mar. 5, 2014 for European Patent Application No. EP 13 177 515.7 which shares priority of Korean Patent Application No. KR 10-2012-0131115 with captioned U.S. Appl. No. 13/827,915, and cites the above-identified reference Nos. 1-4.

ORGANIC LIGHT-EMITTING DISPLAY SYSTEM AND METHOD OF MANUFACTURING THE SAME

CROSS-REFERENCE TO RELATED APPLICATIONS

This application is a divisional of U.S. patent application Ser. No. 13/827,915, filed on Mar. 14, 2013, which claims the benefit of Korean Patent Application No. 10-2012-0131115, filed on Nov. 19, 2012, in the Korean Intellectual Property Office, the disclosures of which are incorporated herein in by reference.

BACKGROUND

1. Technological Field

The disclosed technology relates to an organic light-emitting display system and a method of manufacturing the same, and more particularly, to an organic light-emitting display system and manufacturing method which enhances the sealing force of a thin film encapsulation layer surrounding the light-emitting portion of the display system.

2. Description of the Related Technology

An organic light-emitting display system includes an organic light-emitting device or diode (OLED) including a hole injection electrode, an electron injection electrode, and an organic light-emitting layer formed between the hole injection electrode and the electron injection electrode. Such a display system is self-emissive system in that light is emitted when excitons, which are generated when electrons injected from the hole injection electrode and electrons injected from the electron injection electrode combine with each other in the organic light-emitting layer, drop from an excited state to a ground state.

Since an OLED display does system not require a separate light source, system it can operate at a low voltage and has a light and thin design. This next-generation display system has additional advantages such as wide viewing angle, high contrast, and fast response. However, since organic system materials are susceptible to degradation from external moisture or oxygen, the light-emitting region must be effectively sealed.

In order to make an OLED display system lightweight and/or flexible, recent attempts have been made to develop a thin film encapsulation member that includes a stack of layers formed by laying down inorganic films, or organic films and inorganic films.

As an inorganic film will generally have a greater thickness, it may more effectively prevent penetration of external moisture or oxygen than an organic film. However, as the thickness of an inorganic film increases, stress also increases, thereby allowing the inorganic film to peel off. Once an encapsulation member is damaged or removed, the lifetime of the display is reduced. system

SUMMARY OF CERTAIN INVENTIVE ASPECTS

The present invention provides an organic light-emitting display system which may improve a sealing force of a thin film encapsulation layer and a method of manufacturing the organic light-emitting display system.

According to an aspect of the present invention, there is provided an organic light-emitting display system including: a substrate; a display unit that defines an active area on the substrate and comprises a plurality of thin film transistors (TFTs); and an encapsulation layer that seals the display unit and has a stacked structure in which at least a first inorganic film, a first organic film, and a second inorganic film are sequentially stacked, wherein the TFTs includes an active layer, a gate electrode, a source electrode, a drain electrode, and an interlayer insulating film that is disposed between the gate electrode and the source electrode and between the gate electrode and the drain electrode, wherein the second inorganic film directly contacts the interlayer insulating film at points that are substantially outside the active area.

The second inorganic film and the interlayer insulating film may be formed of the same material.

The film material is silicon nitride (SiNx).

The display unit may further comprises an organic light-emitting device (OLED), wherein the OLED comprises: a pixel electrode that is connected to either one of the source electrode and the drain electrode; an intermediate layer that is formed on the pixel electrode and includes an organic light-emitting layer; and a counter electrode that is formed on the intermediate layer, wherein the first inorganic film is formed on the counter electrode.

The organic light-emitting display system may further include a protective layer that is formed between the counter electrode and the first inorganic film.

The protective layer may include a capping layer that covers the counter electrode and a shield layer that is formed on the capping layer, wherein the shield layer is formed of lithium fluoride (LiF) having a pin-hole structure.

The first inorganic film may be formed of aluminum oxide (AlOx).

The encapsulation layer may further include a second organic film that is formed on the second inorganic film, and a third inorganic film that is formed on the second organic film, wherein the third inorganic film contacts a top surface of the second inorganic film at points that are substantially outside the active area.

The second inorganic film and the third inorganic film may be formed of the same material.

The coverage area of each of the second inorganic film and the third inorganic film is greater than the coverage area of the first inorganic film.

According to another aspect of the present invention, there is provided an organic light-emitting display system including: a substrate; a display unit that defines an active area on the substrate, and comprises a plurality of thin film transistors (TFTs) and plurality of organic light-emitting device (OLEDs) such that a respective one of the TFTs is electrically connected to a respective one of the OLEDs; an encapsulation layer that seals the display unit, and has a stacked structure in which at least a first inorganic film, a first organic film, and a second inorganic film are sequentially stacked; and a protective layer that is formed between the encapsulation layer and the display unit, wherein the TFTs comprises an interlayer insulating film that extends to points that are substantially outside of the active area, wherein the coverage area of the second inorganic film is greater than the coverage area of each of the first inorganic film and the first organic film, and the second inorganic film contacts a top surface of the interlayer insulating film at points that are substantially outside the active area.

The interlayer insulating film and the second inorganic film are formed of the same material.

The organic light-emitting display system, wherein the protective layer comprises a capping layer that covers the counter electrode, and a shield layer that is formed on the capping layer, wherein the first inorganic film surrounds the protective layer.

The thickness of the first inorganic film is greater than the thickness of the first organic film.

The shield layer is formed of lithium fluoride (LiF) having a pin-hole structure, and the first inorganic film is formed of aluminum oxide (AlOx).

The encapsulation layer further comprises a second organic film that is formed on the second inorganic film, and a third inorganic film that is formed on the second organic film, wherein the third inorganic film contacts a top surface of the second inorganic film outside the active area.

The second inorganic film and the third inorganic film are formed of the same material.

The film material is silicon nitride (SiNx).

The TFTs further comprises an active layer, a gate electrode, a source electrode, and a drain electrode, wherein the interlayer insulating film is disposed between the gate electrode and the source electrode and between the gate electrode and the drain electrode.

The organic light-emitting device comprises a pixel electrode that is connected to the TFTs, an intermediate layer that is disposed on the pixel electrode and comprises an organic light-emitting layer, and a counter electrode that is formed on the intermediate layer, wherein the shield layer covers the counter electrode.

According to another aspect of the present invention, there is provided a method of manufacturing an organic light-emitting display system, the method including: forming a display unit that defines an active area on a substrate; forming a protective layer on the display unit; forming a first inorganic film on the protective layer; forming a first organic film on the first inorganic film; and forming a second inorganic film to cover the first inorganic film and the first organic film, wherein the display unit comprises an interlayer insulating film that extends to points that are substantially outside of the active area, and the second inorganic film contacts a top surface of the interlayer insulating film outside the active area.

The forming of the protective layer comprises forming a capping layer on the display unit and forming a shield layer on the capping layer, wherein the shield layer is formed of lithium fluoride (LiF) having a pin-hole structure.

The first inorganic film is formed by using sputtering, and is formed of aluminum oxide (AlOx).

The method further comprises: forming a second organic film on the second inorganic film; and forming a third inorganic film on the second organic film, wherein the second inorganic film and the third inorganic film are formed by using chemical vapor deposition (CVD).

The third inorganic film contacts a top surface of the second inorganic film outside the active area, and the third inorganic film and the second inorganic film may be formed of the same material.

The interlayer insulating film and the second inorganic film are formed of the same material.

An organic light-emitting display system, comprising: a substrate; a display unit formed on the substrate comprising a central pixel portion having a plurality of pixels, each pixel comprising a thin film transistors (TFT) and an organic light emitting diode (OLED); and an encapsulation layer that seals the display unit and has a stacked structure in which at least a first inorganic film, a first organic film, and a second inorganic film are sequentially stacked, wherein the TFTs comprise a non-conductive layer, wherein the second inorganic film extends beyond the pixel portion and contact the non-conductive layer in a peripheral portion of the display.

The inorganic non-conductive layer is an interlayer insulating film.

BRIEF DESCRIPTION OF THE DRAWINGS

The above and other features and advantages of the disclosed technology will become more apparent by describing in detail exemplary embodiments thereof with reference to the attached drawings in which.

DETAILED DESCRIPTION OF CERTAIN INVENTIVE EMBODIMENTS

Figure 1:
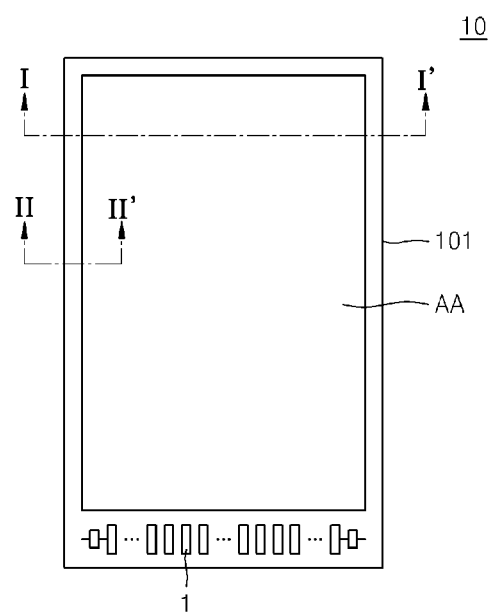
FIG. 1 is a plan view illustrating an organic light-emitting display system according to an embodiment of the disclosed technology.

As used herein, the term "and/or" includes any and all combinations of one or more of the associated listed items. Expressions such as "at least one of," when preceding a list of elements, modify the entire list of elements and do not modify the individual elements of the list.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. While describing the present invention, detailed descriptions about related well known functions or configurations that may blur the points of the present invention are omitted.

It will be understood that, although the terms first, second, etc. may be used herein to describe various elements, these elements should not be limited by these terms. These terms are only used to distinguish one element from another.

It will be understood that when an element or layer is referred to as being "formed on," another element or layer, it can be directly or indirectly formed on the other element or layer. That is, for example, intervening elements or layers may be present.

The present invention will now be described more fully with reference to the accompanying drawings, in which exemplary embodiments of the invention are shown. Like elements are denoted by like reference numerals in the drawings and a repeated explanation thereof will not be given. Thicknesses of layers and regions are enlarged for clarity in the drawings. Thicknesses of some layers and regions are exaggerated for convenience of explanation in the drawings.

Figure 2:
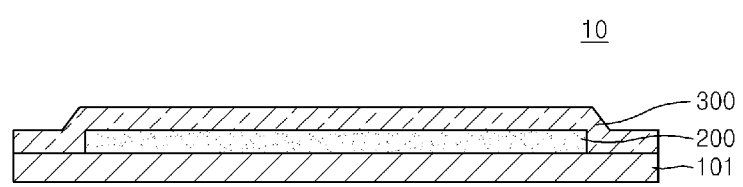
FIG. 2 is a cross-sectional view taken along line I-I' of FIG. 1.
Figure 3:
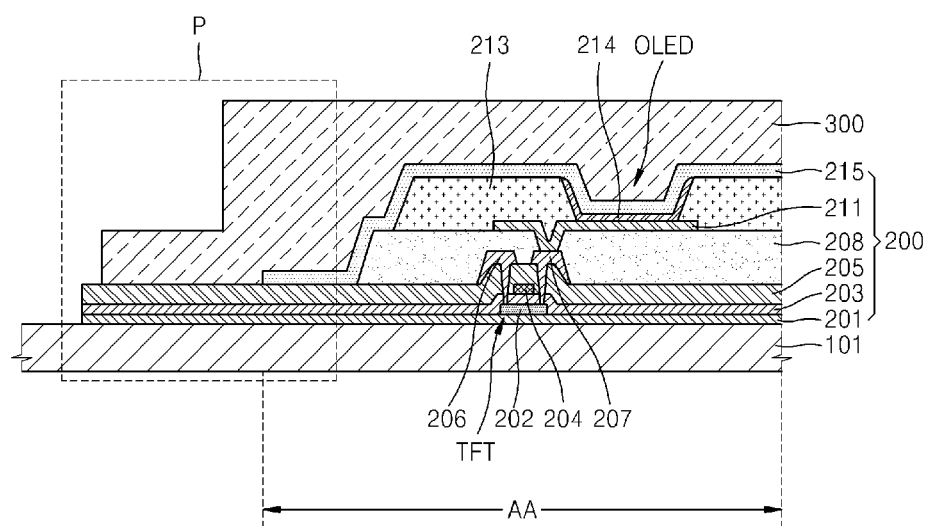
FIG. 3 is a cross-sectional view taken along line II-II' of FIG. 1.
Figure 4:
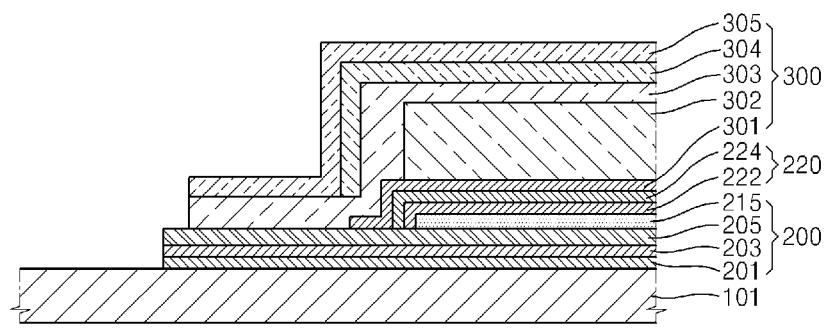
FIG. 4 is an enlarged view illustrating a portion P of FIG. 3.

FIG. 1 is a plan view illustrating an organic light-emitting display system 10 according to an embodiment. FIG. 2 is a cross-sectional view taken along line I-I' of FIG. 1. FIG. 3 is a cross-sectional view taken along line II-II' of FIG. 1. FIG. 4 is an enlarged view illustrating portion P of FIG. 3.

Referring to FIGS. 1 through 4, the organic light-emitting display system 10 includes a substrate 101, a display unit 200 that defines an active area AA on the substrate 101, and an encapsulation layer 300 that seals the display unit 200.

The substrate 101 can be rigid or flexible, and can be formed of plastic having high heat resistance and high durability such as polyimide, polyethylene terephthalate (PET), polycarbonate, polyethylene naphtalate, polyarylate (PAR), and polyetherimide. However, the present embodiment is not limited thereto, and the substrate 101 can be formed of any of other various materials such as a metal and glass.

The display unit 200 defines the active area AA on the substrate 101, and includes a plurality of pixels where each pixel has a thin film transistor (TFT) and an organic light-emitting device (OLED) which are electrically connected to each other. A pad unit 1 is typically disposed around the active area AA, and transmits an electrical signal from a power supply device (not shown) or a signal generating device (not shown) to the active area AA. While subsequent figures will explain various embodiments of a single TFT and OLED with respect an individual pixel, it will be understood by a technologist who has skill in the relevant field that a matrix of pixels is formed in the active area at the same time using the layers and films that will be explained below. It will also be understood that commercial products will typically employ several subpixels of different colors, such as red, green and blue to form a complete pixel, but such usage details are well-known and will not be further considered here. Furthermore, also not shown is any supporting circuitry that is used to complement the TFT and OLED to form a pixel or the circuitry required to drive data to the pixels, for example.

The display unit 200 with respect to a pixel will be explained in greater detail with reference to FIG. 3.

In this embodiment, a buffer layer 201 is formed on the substrate 101. The buffer layer 201 is formed over an entire surface of the substrate 101, that is, on and around the active area AA. The buffer layer 201 is used to prevent impurities from penetrating into the substrate 101 and planarize the substrate 101. It may be formed of any of various materials according to design needs.

For example, the buffer layer 201 may include an inorganic material such as silicon oxide, silicon nitride, silicon oxynitride, aluminum oxide, aluminum nitride, titanium oxide, or titanium nitride or an organic material such as polyimide, polyester, or acryl, and may have a stacked structure in which two or more of the materials are stacked.

With reference to FIG. 2, the TFT is formed on the buffer layer 201 and includes an active layer 202, a gate electrode 204, a source electrode 206, and a drain electrode 207.

The active layer 202 may be formed of an inorganic semiconductor such as amorphous silicon or polysilicon, an organic semiconductor, or an oxide semiconductor, and includes a source region, a drain region, and a channel region.

A gate insulating film 203 is formed on the active layer 202. The gate insulating film 203 is formed to correspond to the entire surface of the substrate 101. That is, the gate insulating film 203 is formed on and around the active area AA of the substrate 101. The gate insulating film 203 for insulating the active layer 202 from the gate electrode 204 may be formed of an organic material or an inorganic material such as SiNx or $SiO_2$.

The gate electrode 204 is formed on the gate insulating film 203. The gate electrode 204 may be formed of gold (Au), silver (Ag), copper (Cu), nickel (Ni), platinum (Pt), palladium (Pd), aluminum (Al), or molybdenum (Mo), or an alloy such as Al:Nd or Mo:W, but embodiments are not limited thereto and gate electrode 204 may be formed of any of other various materials in consideration of design constraints.

An interlayer insulating film 205 is formed on the gate electrode 204. The interlayer insulating film 205 is generally formed to correspond to the entire surface of the substrate 101. That is, the interlayer insulating film 205 is formed on and around the active area AA.

The interlayer insulating film 205 that is disposed between the gate electrode 204 and the source electrode 206 and between the gate electrode 204 and the drain electrode 207 and insulates the gate electrode 204 from each of the source electrode 206 and the drain electrode 207 may be formed of an inorganic material such as SiNx or $SiO_2$. The interlayer insulating film 205 may formed of SiNx, or have a two-layer structure including a SiNx layer and a $SiO_2$ layer. When the interlayer insulating film 205 has a two-layer structure, it is preferable that in order to improve the adhesive force between the interlayer insulating film 205 and the encapsulation layer, an upper layer is formed as a SiNx layer.

The source electrode 206 and the drain electrode 207 are formed on the interlayer insulating film 205. Furthermore, the interlayer insulating film 205 and the gate insulating film 203 are formed to expose the source region and the drain region of the active layer 202, and the source electrode 206 and the drain electrode 207 are formed to contact the exposed source region and the exposed drain region of the active layer 202.

Although the referenced TFT is shown as a top gate TFT in which the active layer 202, the gate electrode 204, and the source and drain electrodes 206 and 207 are sequentially stacked, embodiments are not limited thereto and the gate electrode 204 can be disposed under the active layer 202.

The TFT drives the OLED by being electrically connected to the OLED and is protected by being covered by a passivation layer 208.

The passivation layer 208 as disclosed includes an inorganic insulating film and/or an organic insulating film. The inorganic insulating film may be formed of $SiO_2$, SiNx, SiON, $Al_2O_3$, $TiO_2$, $Ta_2O_5$, $HfO_2$, $ZrO_2$, BST, or PZT, and the organic insulating film may be formed of a general polymer such as polymethyl methacrylate (PMMA) or polystyrene (PS), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, or a blend thereof. Also, the disclosed passivation layer 208 has a stacked structure including an inorganic insulating film and an organic insulating film.

The light-emissive device such as OLED is generally formed on the passivation layer 208, and it includes a pixel electrode 211, an intermediate layer 214, and a counter electrode 215.

The pixel electrode 211 is formed on the passivation layer 208. Furthermore, the passivation layer 208 may be formed to expose a predetermined portion of the drain electrode without covering the entire surface of the drain electrode 207, and the pixel electrode 211 may be formed to be connected to the exposed portion of the drain electrode 207.

The pixel electrode 211 may be a reflective electrode, and may include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The counter electrode 215 that faces the pixel electrode 211 may be a transparent or semi-transparent electrode, and may include a metal thin film having a low work function formed of lithium (Li), calcium (Ca), lithium fluoride (LiF)/Ca, LiF/Al, Al, Ag, Mg, or a compound thereof. Also, an auxiliary electrode layer or a bus electrode formed of a transparent electrode-forming material such as ITO, IZO, ZnO, or $In_2O_3$ may be further formed on the metal thin film.

Accordingly, the counter electrode 215 transmits therethrough light emitted from an organic light-emitting layer included in the intermediate layer 214. That is, light emitted from the organic light-emitting layer will be directly transmitted to the counter electrode 215, or will be reflected by the pixel electrode 211 including a reflective electrode and then transmitted to the counter electrode 215.

However, the organic light-emitting display system 10 is not limited to a top emission organic light-emitting display system, and may be a bottom emission organic light-emitting display system in which light emitted from the organic light-emitting layer is transmitted to the substrate 101. In this case, the pixel electrode 211 may be a transparent or semi-transparent electrode, and the counter electrode 215 may be a reflective electrode. Also, the organic light-emitting display system 10 may be a dual-sided emission organic light-emitting display system in which light is transmitted to both a top surface and a bottom surface.

A pixel-defining film 213 formed of an insulating material is formed on the pixel electrode 211. The pixel-defining film 213 is processed to expose a predetermined portion of the pixel electrode 211, and the intermediate layer 214, including the organic light-emitting layer, is formed on the exposed portion of the pixel electrode 211.

The organic light-emitting layer may be formed of either a low molecular weight organic material or a high molecular weight organic material. The intermediate layer 214 may selectively further include a functional layer such as a hole transport layer (HTL), a hole injection layer (HIL), an electron transport layer (ETL), or an electron injection layer (EIL) in addition to the organic light-emitting layer.

The encapsulation layer 300 is formed on the counter electrode 215. In the depicted embodiment, the encapsulation layer 300 includes at least a first inorganic film 301, a first organic film 302, and a second inorganic film 303. Also, as shown in FIG. 4, a protective layer 220 may be further formed between the encapsulation layer 300 and the display unit 200.

The protective layer 220 may include a capping layer 222 that covers the counter electrode 215, and a shield layer 224 that is disposed on the capping layer 222.

The capping layer 222 may be formed of an organic material such as a-NPD, NPB, TPD, m-MTDATA, $Alq_3$, or CuPc. The capping layer 222 is used to enhance light transmission as well as protect the OLED.

The shield layer 224 may be formed of an inorganic material such as LiF, $MgF_2$, or $CaF_2$. The shield layer 224 is used to prevent plasma used in forming the first inorganic film 310 from penetrating into the OLED and damaging the intermediate layer 214 and the counter electrode 215. The shield layer 224 may be formed of LiF having a pin-hole structure.

The first inorganic film 301 is formed on the protective layer 220. The first inorganic film 310 may be formed of, for example, aluminum oxide (AlOx). The first inorganic film 301 may be formed by using sputtering to a thickness of about 500 Å. The first inorganic film 301 deposited on the shield layer 224 is grown according to a crystal structure of the shield layer 224. That is, fine cracks exist on the entire surface of the first inorganic film 301 formed on the shield layer 224.

The first organic film 302 formed on the first inorganic film 301 may include a high molecular weight organic compound. Outgassing in which gas is released can occur in the high molecular weight organic compound. The gas can penetrate into the OLED. In this case, when the first inorganic film 301 is cracked by particles or the like, the gas generated in the organic compound can concentrate on the cracks, thereby oxidizing the counter electrode 215 of the OLED and resulting in unintended dark spots.

However, according to various embodiments, since the fine cracks exist on the entire surface of the first inorganic film 301, even when gas is released from the first organic film 302, the gas may not be concentrated on a single point. That is, since gas generated in the first organic film 302 is widely distributed by the fine cracks existing on the entire surface (on average), the counter electrode 215 will generally not be oxidized, and thus, dark spots can be minimized or avoided.

The first organic film 302 can be formed on the first inorganic film 301 to have a predetermined thickness, for example, a thickness of about 30000 Å so as to planarize a stepped portion (see OLED label in FIG. 3) formed due to the OLED processing including formation of the pixel-defining film 213. The first organic film 302 may be formed of any one of epoxy, acrylate, and urethane acrylate. Typically, the thickness of the first organic film 302 will be less than the thickness of the first inorganic film 301.

The second inorganic film 303 is formed to surround the first inorganic film 301 and the first organic film 302. That is, since the entire surface of the first organic film 302 is surrounded by the first inorganic film 301 and the second inorganic film 303, penetration of external moisture or oxygen into the active area of the display may be effectively prevented.

The second inorganic film 303 may be formed of, for example, SiNx, and may be formed by using chemical vapor deposition (CVD) to a thickness of about 10000 Å. Accordingly, even when particles exist on the first organic film 302, a raised portion formed due to particles being introduced during the manufacturing process will be covered. Also, since the second inorganic film 303 is formed by using CVD that does not use plasma, the first organic film 302 will not be damaged when the second inorganic film 303 is formed, and thus, outgassing will be prevented.

The second inorganic film 303 is formed to cover a larger area than the first inorganic film 301, and directly contacts the interlayer insulating film 205 at points that are substantially outside the active area AA. Also, the second inorganic film 303 may be formed of the same material as the material of the interlayer insulating film 205. That is, since the second inorganic film 303 is formed of SiNx, and the interlayer insulating film 205 is formed of SiNx or when the interlayer insulating film 205 has a two-layer structure, an upper layer is a SiNx layer, an adhesive force between the second inorganic film 303 and the interlayer insulating film 205 will be enhanced. Accordingly, in various embodiments, as the second inorganic film 303 is formed to a thickness sufficient to cover undesired particulate matter, even when stress on the film increases, the second inorganic film 303 is prevented from being peeled off to large extent, and thus, penetration of unwanted external moisture or oxygen is reduced or avoided.

A second inorganic film 304 and a third inorganic film 305 may be formed on the second inorganic film 303. Although not shown in FIGS. 1 through 4, in other embodiments, a fourth inorganic film (not shown) formed of AlOx may be further formed on an outer surface of the encapsulation layer 300.

The second organic film 304 may be formed of any one of epoxy, acrylate, and urethane acrylate, and may be formed to a thickness of about 10000 Å. The second organic film 304 is used to reduce stress on the first inorganic film 301 and planarize particles, if any.

The third inorganic film 305 covers the second organic film 304. The third inorganic film 305 has a thickness of about 10000 Å, and contacts a top surface of the second inorganic film 303 at points that are substantially outside the active area AA.

The third inorganic film 305 may be formed of the same material as the material of the second inorganic film 303. For example, the third inorganic film 305 may be formed of SiNx. Accordingly, the adhesive force between the third inorganic film 305 and the second inorganic film 303 should increase, thereby effectively further preventing penetration of external moisture or oxygen.

The encapsulation layer 300 may further include a plurality of additional inorganic films and organic films which are alternately stacked, and the number of the inorganic films and organic layers which are stacked is not limited.

Also, a protective film (not shown) is attached to a top surface of the encapsulation layer 300. When the protective film has a strong adhesive force, when the protective film is removed, the encapsulation layer 300 may be peeled off as well. In order to solve this problem, a fourth inorganic film (not shown) formed of AlOx having a weak adhesive force with the protective film may be further formed.

Figure 5:
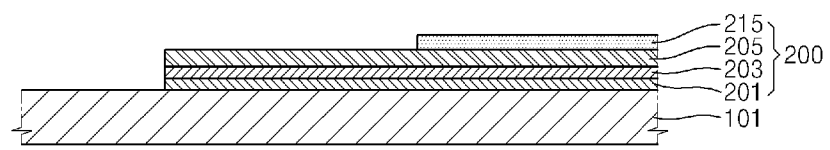
FIGS. 5 through 7 are cross-sectional views for explaining a method of manufacturing the organic light-emitting display system of FIG. 1, according to an embodiment of the disclosed technology.
Figure 6:
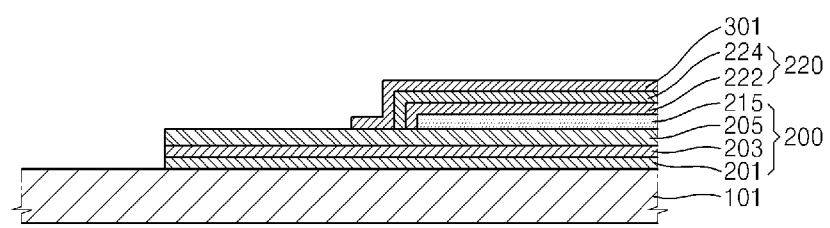
Figure 7:
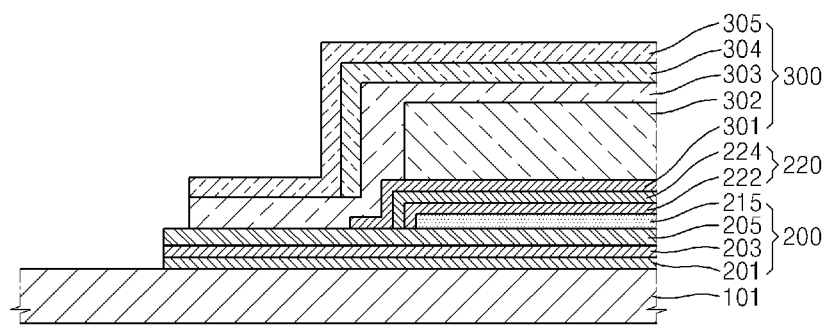

FIGS. 5 through 7 are cross-sectional views for explaining a method of manufacturing the organic light-emitting display system 10 of FIG. 1. The display unit 200 is the same as that described with reference to FIG. 3, and thus part of a structure of the display unit 200 is not shown in FIGS. 5 through 7.

A method of manufacturing the organic light-emitting display system 10 will be explained with reference to FIGS. 5 through 7 along with FIG. 4.

Referring to FIG. 5, the display unit 200 that defines the active area AA is formed on the substrate 101. Since the display unit 200 may incorporate a pixel structure as shown in FIG. 3 and may be made of any of various well-known organic light-emitting display designs, a method of manufacturing the display unit 200 will not be explained. The display unit 200 includes the buffer layer 201, the gate insulating film 203, and the interlayer insulating film 205 which extend to locations that are substantially outside the active area AA. The interlayer insulating film 205 which is disposed between the gate electrode 204 (see FIG. 3) and the source electrode 206 (see FIG. 3) and between the gate electrode 204 (see FIG. 3) and the drain electrode 207 (see FIG. 3) and insulates the gate electrode 204 from each of the source electrode 206 and the drain electrode 207 may be formed of an inorganic material such as SiNx or SiO$_2$. The interlayer insulating film 205 may be formed of SiNx, or may be formed to have a two-layer structure including a SiNx layer and a SiO2 layer. When the interlayer insulating film 205 has a two-layer structure, an upper layer may be a SiNx layer in order to improve the adhesive force between the interlayer insulating film 205 and the second inorganic film 303.

Referring to FIG. 6, the protective layer 220 and the first inorganic film 301 are formed on the display unit 200.

The protective layer 220 includes the capping layer 222 formed of an organic material such as a-NPD, NPB, TPD, m-MTDATA, Alq$_3$, or CuPc, and the shield layer 224 formed of LiF. The first inorganic film 301 may be formed of AlOx. Also, the first inorganic film 301 may be formed by using sputtering to a thickness of about 500 Å.

Since the lithium fluoride (LiF) has a pin-hole structure and the first inorganic layer 301 deposited on the shield layer 224 is grown according to a crystal structure of the shield layer 224, fine cracks exist on an entire surface of the first inorganic film 301. Accordingly, even when a gas is generated in the first organic film 302 (see FIG. 7) formed on the first inorganic film 301, the gas will generally be widely distributed by the fine cracks existing on the entire surface of the first inorganic film 301 (on average), and may be prevented from concentrating on a single point. Accordingly, the counter electrode 215 may be prevented from being oxidized and dark spots may be avoided.

Referring to FIG. 7, the first organic film 302, the second inorganic film 303, the second organic film 304, and the third inorganic film 305 are sequentially formed.

The first organic film 302 may be formed to a predetermined thickness, for example, a thickness of about 30000 Å, great enough to planarize a stepped portion formed due to the pixel-defining film 213 (see FIG. 3). The first organic film 302 may be formed of any one of epoxy, acrylate, and urethane acrylate. In order for the covered area of the first organic film 302 to be less than the covered area of the first inorganic film 301, a mask having a smaller opening may be used to form the first organic film 302.

The second inorganic film 303 is formed to surround the first inorganic film 301 and the first organic film 302. That is, since an entire surface of the first organic film 302 is surrounded by the first inorganic film 301 and the second inorganic film 303, penetration of external moisture or oxygen will be reduced or prevented.

The second inorganic film 303 may be formed of, for example, SiNx, and may be formed by using CVD to a thickness of about 10000 Å. Accordingly, even when particles exist on the first organic film 302, a raised portion formed due to the particles will be covered. Also, since the second inorganic film 303 is formed by using CVD that does not use plasma, the first organic film 302 may be prevented from being damaged when the second inorganic film 303 is formed, thereby preventing outgassing in which a gas is generated in the first organic film 302.

The second inorganic film 303 is formed to be larger in area than the first inorganic film 301, and directly contacts the interlayer insulating film 205 at points that are substantially outside the active area AA. Also, the second inorganic film 303 may be formed of the same material as a material of the interlayer insulating film 205. For example, since the second inorganic film 303 is formed of SiNx, and the interlayer insulating film 205 is formed SiNx or when the interlayer insulating film 205 has a two-layer structure, an upper layer is a SiNx layer, the adhesive force between the second inorganic film 303 and the interlayer insulating film 205 may be improved. Accordingly, as the second inorganic film 303 is formed to a thickness that is sufficient to cover undesired particulate matter, even when stress on the film is increases, the second inorganic film 303 may be prevented from being peeled off and thus penetration of external moisture or oxygen will be reduced or prevented.

The second organic film 304 may include any one of epoxy, acrylate, and urethane acrylate, and may be formed to a thickness of about 10000 Å. The second organic film 304 reduces stress on the first organic film 301, and planarizes particles, if any.

The third inorganic film 305 covers the second organic film 304. The third inorganic film 305 may have a thickness of about 10000 Å, and may be formed by using CVD, thereby preventing damage to the second organic film 304.

Also, the third inorganic film 305 may contact a top surface of the second inorganic film 303 outside the active area AA, and the third inorganic film 305 may be formed of the same material as a material of the second inorganic film 303. For example, the third inorganic film 305 may be formed of SiNx. Accordingly, the adhesive force between the third inorganic film 305 and the second inorganic film 303 will be enhanced, thereby effectively preventing penetration of external moisture or oxygen.

The encapsulation layer 300 may further includes a plurality of additional inorganic films and organic films which are alternately stacked. The number of the inorganic films and organic films which are stacked is not limited.

A flexible display system is not limited to disclosed structures and methods of the embodiments, and embodiments may be modified by selectively combining all or some elements of other embodiments.

While the inventive concept has been particularly shown and described with reference to exemplary embodiments thereof, they are provided for the purposes of illustration and it will be understood by those of ordinary skill in the art that various modifications and equivalent other embodiments can be made from the inventive concept. Accordingly, the true technical scope of the inventive concept is defined by the technical spirit of the appended claims.

What is claimed is:

1. An organic light-emitting display system, comprising:
   a substrate;
   a display unit that defines an active area on the substrate, and comprises a plurality of thin film transistors (TFTs) and a plurality of organic light-emitting devices (OLEDs);
   an encapsulation layer that seals the display unit, and has a stacked structure in which at least a first inorganic film, a first organic film, and a second inorganic film are sequentially stacked from bottom to top; and
   a protective layer that is formed between the encapsulation layer and the display unit,
   wherein the TFTs comprise an interlayer insulating film that extends to points that are substantially outside of the active area,
   wherein the coverage area of the second inorganic film is greater than the coverage area of each of the first inorganic film and the first organic film, and the second inorganic film contacts a top surface of the interlayer insulating film at points that are substantially outside the active area.

2. The organic light-emitting display system of claim 1, wherein the interlayer insulating film and the second inorganic film are formed of the same material.

3. The organic light-emitting display system of claim 1, wherein the protective layer comprises a capping layer that covers the counter electrode, and a shield layer that is formed on the capping layer,
   wherein the first inorganic film surrounds the protective layer.

4. The organic light-emitting display system of claim 1, wherein the coverage area of the first inorganic film is greater than the coverage area of the first organic film.

5. The organic light-emitting display system of claim 3, wherein the shield layer is formed of lithium fluoride (LiF) having a pin-hole structure, and the first inorganic film is formed of aluminum oxide (AlOx).

6. The organic light-emitting display system of claim 1, wherein the encapsulation layer further comprises a second organic film that is formed on the second inorganic film, and a third inorganic film that is formed on the second organic film,
   wherein the third inorganic film contacts a top surface of the second inorganic film outside the active area.

7. The organic light-emitting display system of claim 6, wherein the second inorganic film and the third inorganic film are formed of the same material.

8. The organic light-emitting display system of claim 7, wherein the film material is silicon nitride (SiNx).

9. The organic light-emitting display system of claim 1, wherein the TFTs further comprise an active layer, a gate electrode, a source electrode, and a drain electrode,
   wherein the interlayer insulating film is disposed between the gate electrode and the source electrode and between the gate electrode and the drain electrode.

10. The organic light-emitting display system of claim 1, wherein the organic light-emitting device comprises a pixel electrode that is connected to the TFTs, an intermediate layer that is disposed on the pixel electrode and comprises an organic light-emitting layer, and a counter electrode that is formed on the intermediate layer,
    wherein the shield layer covers the counter electrode.

11. An organic light-emitting display system, comprising:
    a substrate;
    a display unit formed on the substrate comprising a central pixel portion having a plurality of pixels, each pixel comprising a thin film transistors (TFT) and an organic light emitting diode (OLED); and
    an encapsulation layer that seals the display unit and has a stacked structure in which at least a first inorganic film, a first organic film, and a second inorganic film are sequentially stacked from bottom to top,
    wherein the TFTs comprise a non-conductive layer,
    wherein the second inorganic film extends beyond the pixel portion and contact the non-conductive layer in a peripheral portion of the display unit, and
    wherein the coverage area of the second inorganic film is greater than the coverage area of each of the first inorganic film and the first organic film, and the second inorganic film contacts a top surface of the non-conductive layer at points that are substantially outside the active area.

12. The display system of claim 11, wherein the inorganic non-conductive layer is an interlayer insulating film.

13. The display system of claim 11, wherein the second inorganic film and the non-conductive layer are formed of the same material.

14. The display system of claim 11, wherein the first inorganic film is formed of aluminum oxide (AlOx).

15. The display system of claim 11, wherein the second inorganic film covers the first organic film.

16. The display system of claim 11,
    wherein the encapsulation layer further comprises a second organic film that is formed on the second inorganic film, and a third inorganic film that is formed on the second organic film,
    wherein the third inorganic film contacts a top surface of the second inorganic film at points that are substantially outside the active area.

17. The display system of claim 16, wherein the third inorganic film covers the second organic film.

18. The display system of claim 16, wherein the second inorganic film and the third inorganic film are formed of the same material.

19. The display system of claim 16, wherein the second inorganic film and the third inorganic film have the same end positions.

* * * * *